United States Patent
Chou et al.

(10) Patent No.: US 10,971,544 B2
(45) Date of Patent: Apr. 6, 2021

(54) INTEGRATION OF MAGNETO-RESISTIVE RANDOM ACCESS MEMORY AND CAPACITOR

(71) Applicant: Taiwan Semiconductor Manufacturing Company, Ltd., Hsin-Chu (TW)

(72) Inventors: Chung-Cheng Chou, Hsin-Chu (TW); Ya-Chen Kao, Fuxing Township (TW); Tien-Wei Chiang, Taipei (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 4 days.

(21) Appl. No.: 16/045,237

(22) Filed: Jul. 25, 2018

(65) Prior Publication Data
US 2018/0350877 A1    Dec. 6, 2018

Related U.S. Application Data

(62) Division of application No. 14/066,978, filed on Oct. 30, 2013, now Pat. No. 10,522,591.

(60) Provisional application No. 61/779,306, filed on Mar. 13, 2013.

(51) Int. Cl.
*H01L 27/22* (2006.01)
*H01L 43/12* (2006.01)
*H01L 43/10* (2006.01)

(52) U.S. Cl.
CPC ............ *H01L 27/228* (2013.01); *H01L 43/12* (2013.01); *H01L 43/10* (2013.01)

(58) Field of Classification Search
CPC ................................ H01L 27/228; H01L 43/08
See application file for complete search history.

(56) References Cited

U.S. PATENT DOCUMENTS

| 6,784,510 B1* | 8/2004 | Grynkewich | B82Y 10/00 257/225 |
| 2004/0150016 A1* | 8/2004 | Ooishi | B82Y 10/00 257/295 |
| 2005/0057960 A1 | 3/2005 | Saito et al. | |
| 2005/0270828 A1* | 12/2005 | Motoyoshi | B82Y 10/00 365/158 |
| 2006/0002184 A1 | 1/2006 | Hong et al. | |

(Continued)

*Primary Examiner* — Samuel A Gebremariam
*Assistant Examiner* — Jonas T Beardsley
(74) *Attorney, Agent, or Firm* — Haynes and Boone, LLP

(57) ABSTRACT

Methods for forming a magneto-resistive memory device and a capacitor in an interconnect structure are disclosed herein. An exemplary method includes forming a first level interconnect metal layer and a second level interconnect metal layer of an interconnect structure. The method further includes simultaneously forming a first plurality of layers in a first region of the interconnect structure and a second plurality of layers in a second region of the interconnect structure, wherein the first plurality of layers and the second plurality of layers are disposed between the first level interconnect metal layer and the second level interconnect metal layer. The first plurality of layers is configured as a magneto-resistive memory device. The second plurality of layers is configured as the capacitor. The magneto-resistive memory device and the capacitor are each coupled to the first level interconnect metal layer and the second level interconnect metal layer.

20 Claims, 10 Drawing Sheets

(56) References Cited

U.S. PATENT DOCUMENTS

2013/0058162 A1* 3/2013 Yamanaka .............. H01L 43/08
  365/173
2013/0126996 A1* 5/2013 Jeong ...................... H01L 43/08
  257/421

* cited by examiner

INTEGRATION OF MAGNETO-RESISTIVE RANDOM ACCESS MEMORY AND CAPACITOR

This is a divisional application of U.S. patent application Ser. No. 14/066,978, filed Oct. 30, 2013, which claims the benefit of U.S. Provisional Patent Application Ser. No. 61/779,306, filed Mar. 13, 2013, both of which are incorporated herein by reference in their entirety.

BACKGROUND

In integrated circuit (IC) devices, magneto-resistive random access memory (MRAM) is an emerging technology for next generation non-volatile memory devices. A MRAM device is formed from two ferromagnetic plates, each of which can hold a magnetic field, separated by a thin insulating layer. One of the two plates is a permanent magnet set to a particular polarity, and the other's field can be changed to match that of an external field to store memory. This configuration is the simplest structure for a MRAM bit. A memory device is built from a grid of such cells. Reading data is accomplished by measuring the electrical resistance of the cell. Due to the magnetic tunnel effect, the electrical resistance of the cell changes due to the orientation of the fields in the two plates. The MRAM cells are integrated with other IC devices, such as capacitors. However, a capacitor is almost non-shrinkable and cannot be scaled down to small dimensions due to capacitor characteristics. A capacitor takes a significant circuit area penalty. Accordingly, it would be desirable to provide a structure with MRAM cells and capacitors integrated together and a method of manufacturing thereof absent the disadvantages discussed above.

BRIEF DESCRIPTION OF THE DRAWINGS

Aspects of the present disclosure are best understood from the following detailed descriptions when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
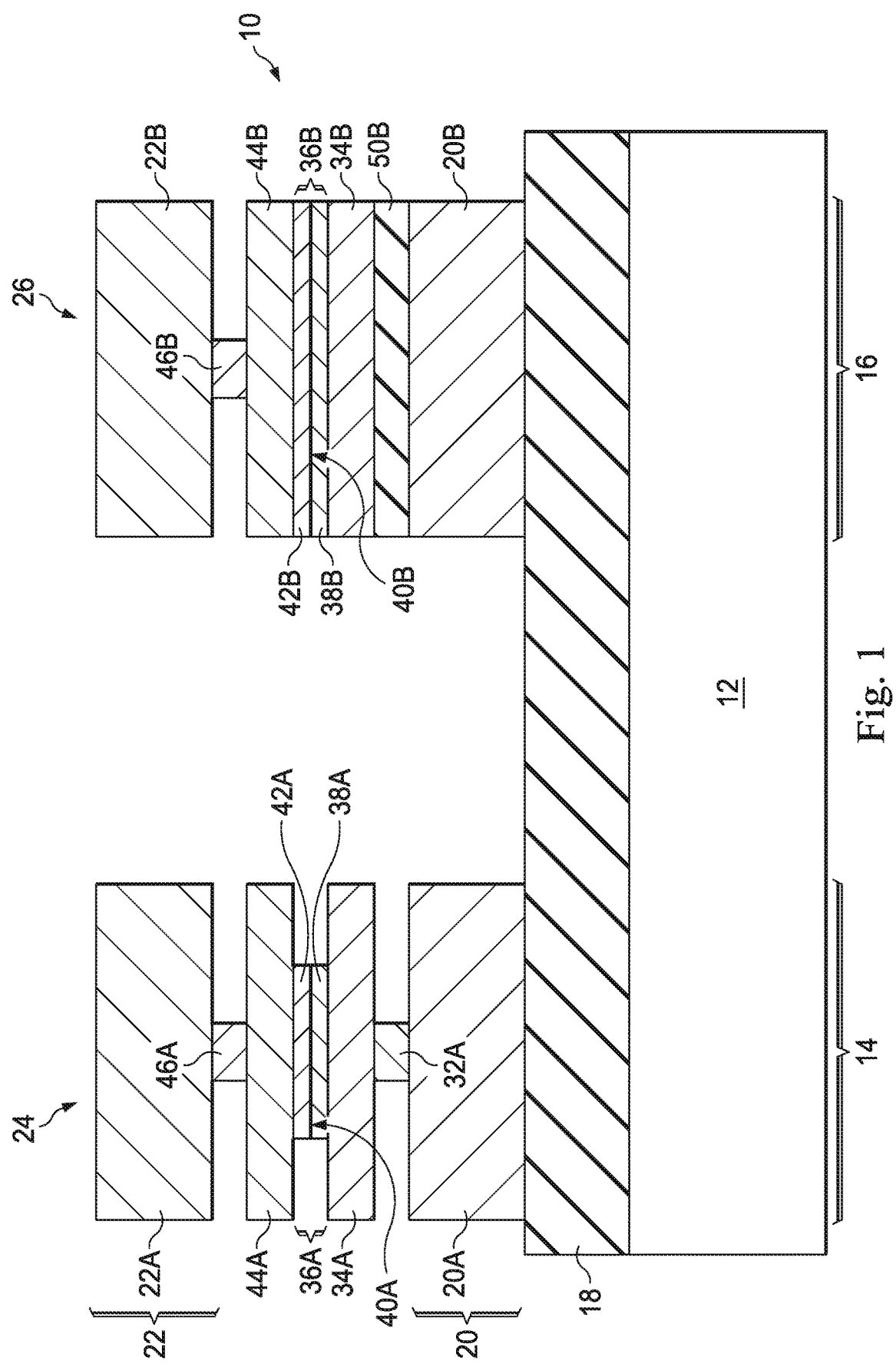
FIG. 1 is a sectional view of a semiconductor structure having a magneto-resistive memory device and a capacitor constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates a sectional view of a semiconductor structure 10 that includes a magneto-resistive memory device and a capacitor integrated on a substrate 12. In one example, the substrate 12 is a semiconductor substrate, such as a silicon substrate or alternatively other suitable semiconductor substrate. Various isolation features, such as shallow trench isolation (STI) features, may be formed on the substrate 12 and define various active regions. In the present embodiment, the substrate 12 includes a first region 14 and a second region 16.

The semiconductor structure 12 may include various patterned layers 18 disposed on the substrate 12. For example, the patterned layers 18 includes gate layers having gate dielectric layer and gate electrode layer patterned to form various gate stacks.

The semiconductor structure 12 includes an interconnect structure having various metal features configured to provide electrical routing and to couple various devices to form a functional circuit. The interconnect structure includes two or more metal layers each having a plurality of metal lines and further includes contacts and vias to vertically connects metal lines in the different metal layers. The patterned layers 18 may include a portion of the interconnect structure, such as contacts and a subset of metal layers.

In the present embodiment, two adjacent metal layers, first metal layer 20 and second metal layer 22, are illustrated in FIG. 1. For example, the first metal layer 20 is the metal-4 (M4) layer and the second metal layer 22 is the metal-5 (M5) layer. In another example, the first metal layer 20 is the metal-x ($M_x$) layer and the second metal layer 22 is the metal-(x+1) ($M_{x+1}$) layer. In furtherance of the present embodiment, the first metal layer 20 includes a first metal feature 20A disposed in the first region 14 and a second metal feature 20B disposed in the second region 16. The second metal layer 22 includes a third metal feature 22A disposed in the first region 14 and a fourth metal feature 22B disposed in the second region 16.

The semiconductor structure 10 includes a magneto-resistive memory device 24 disposed in the first region 14 and a capacitor 26 disposed in the second region 16. Particularly, the magneto-resistive memory device 24 and the capacitor 26 are interposed between the first metal layer 20 and second metal layer 22. In a specific example, the magneto-resistive memory device 24 is sandwiched between the first metal feature 20A and the third metal feature 22A, and the capacitor 26 is sandwiched between the third metal feature 20B and the fourth metal feature 22B.

The magneto-resistive memory device 24 includes a first electrode (or bottom electrode) 34A of conductive material. In one embodiment, the first electrode includes tantalum (Ta), tantalum nitride (TaN) or combination thereof. In other embodiments, the first electrode may include other appropriate conductive material, such as titanium, titanium nitride, or aluminum. In the present example, a seed contact 32A is formed and configured to electrically connect to the first electrode 34A to the first metal feature 20A. The first electrode 34A can be deposited by a physical vapor deposition (PVD or sputtering) or alternatively other suitable processes. The formation of the first electrode 34A further includes a patterning procedure including lithography process and etching. The seed contact 32A may be formed with the first electrode 34A by a same deposition.

The magneto-resistive memory device 24 includes a material stack 36A as a magnetic tunneling junction (MTJ) for the magneto-resistive memory device 24. The material stack 36A is disposed on the first electrode and includes a pinning layer 38A, a barrier layer 40A on the pinning layer 38A and a free layer 42A on the barrier layer 40A.

The pining layer 38A includes an anti-ferromagnetic (AFM) material. In the anti-ferromagnetic material, the magnetic moments of atoms or molecules align in a regular pattern with neighboring spins pointing in opposite directions. In one example, the anti-ferromagnetic layer 38A includes platinum manganese (PtMn). In another example, the anti-ferromagnetic layer 38A includes iridium manganese (IrMn), rhodium manganese (RhMn), and iron manganese (FeMn). In another example, the anti-ferromagnetic layer 38A is formed by a suitable deposition technique, such as PVD.

The barrier layer 40A includes magnesium oxide (MgO). Alternatively, the barrier layer 40A may include aluminum oxide (AlO), aluminum nitride (AlN), aluminum oxynitride (AlON), or other suitable non-magnetic material. The barrier layer 40A is thin enough such that electrons can tunnel through the barrier layer when a bias voltage is applied on. In one embodiment, the barrier layer 40A has a thickness ranging between about 5 angstrom and about 15 angstrom. The barrier layer 40A may be deposited by a PVD process. For example, a magnesium target is used with an oxygen gas provided in a sputtering chamber to form magnesium oxide. Alternatively, a magnesium film is formed first by sputtering and then converting it into the MgO film by applying oxygen plasma.

The free layer 42A includes a ferromagnetic material layer. The ferromagnetic material can form permanent magnets and/or exhibit strong interactions with magnets. In one embodiment, the ferromagnetic layer includes a cobalt-iron-boron (CoFeB) film. The ferromagnetic material layer may alternatively include other materials, such as CoFeTa, NiFe, Co, CoFe, CoPt, CoPd, FePt, or the alloy of Ni, Co and Fe. In one example, the CoFeB film is formed by PVD.

The MTJ material stack 36 is formed by sequential deposition and a patterning procedure including lithography process and etching. In the present embodiment, the MTJ stack 36A is patterned to have a dimension less than that of the first electrode 34A, as illustrated in FIG. 1.

The magneto-resistive memory device 24 further includes a second electrode (or top electrode) 44A of conductive material. In one embodiment, the second electrode 44A is substantially similar to the first electrode 34A in term of composition. For example, the second electrode 44A includes tantalum (Ta), tantalum nitride (TaN) or combination thereof. In another example, the second electrode 44A is deposited by PVD or alternatively other suitable processes. The formation of the first electrode 34A further includes a patterning procedure including lithography process and etching. In one example, the first and second electrodes are patterned by a same patterning procedure including lithography process and etching. In the present embodiment, the magneto-resistive memory device 24 also includes a seed via 46A of conductive material. The seed via 46A is disposed on the second electrode 44A and is configured to electrically connect the second electrode 44A to the second metal feature 22A. The seed via 46A may be formed by a damascene process that includes etching a dielectric material to form a trench and filling in the trench with a conductive material.

The capacitor 26 and the magneto-resistive memory device 24 are formed in a same process procedure. In the present embodiment, the capacitor 26 includes magnetic materials, such as a MTJ stack 36B, at a same level with the MTJ stack 36A of the magneto-resistive memory device but serves for different function. The MTJ stack 36B serves for top electrode connection of the capacitor.

Specifically, the capacitor 26 includes a dielectric material layer 50B. The dielectric material layer 50B includes one of silicon carbide, silicon nitride, and a combination thereof. In one embodiment, the dielectric material layer 50B includes a thickness ranging between about 20 angstrom and about 700 angstrom. In another embodiment, the dielectric material layer 50B is deposited by chemical vapor deposition (CVD) or other suitable technique. The dielectric material layer 50B serves as capacitor dielectric.

The capacitor 26 also includes a conductive feature 34B similar to the first electrode 34A in terms of composition and formation. For example, the conductive feature 34B includes Ta, TaN or other suitable metal or metal alloy. In the present embodiment, the first electrode 34A and the conductive feature 34B are formed simultaneously by a same operation including deposition and patterning. The conductive feature 34B is disposed on the dielectric material layer 50B.

The capacitor 26 includes the second MTJ stack 36B disposed on the conductive feature 34B. The second MTJ stack 36B is similar to the first MTJ stack 36A in terms of composition and formation. For example, the second MTJ stack 36B includes a pinning layer 38B, a barrier layer 40B on the pinning layer 38B and a free layer 42B on the barrier layer 40B. In the present embodiment, the first MTJ stack 36A and the second MTJ stack 36B are formed simultaneously by a same operation including deposition and patterning. The second MTJ stack 36B serves as a conductive layer in the capacitor 26, such as a top electrode connection. The ferromagnetic material and the anti-ferromagnetic material are conductive. The barrier layer 40B is very thin and is conductive due to the tunneling effect of the MTJ structure. The barrier layer 40B may present a certain resistance in the capacitor and is incorporated in a resistor/capacitor (RC)

design since the capacitor is usually connected to and is integrated with a resistor in various applications.

The capacitor 26 also includes conductive features 44B and 46B similar to the 44A and 46B in the magneto-resistive memory device 24, respectively, in terms of composition and formation. For example, the conductive feature 44B includes Ta, TaN or other suitable metal or metal alloy. In the present embodiment, the second electrode 44A and the conductive feature 44B are formed simultaneously by a same operation including deposition and patterning. The conductive feature 44B is disposed on the second MTJ stack 36B.

In the present embodiment, second MTJ stack 36 is patterned to have a dimension same as that of the dielectric material layer 50B and the conductive features 34b and 44B for capacitance. This configuration is different from that of the first MTJ stack 36A in the magneto-resistive memory device 24.

The capacitor 26 further includes the fourth metal feature 22B disposed on and connected with the conductive feature 46B, which serves as a via to couple the second metal feature 22B and the conductive feature 44B. In the present embodiment, the second metal feature 20B serves as the bottom electrode of the capacitor 26. The conductive feature 34B, the second MTJ stack 36B, the conductive feature 44B and the fourth metal feature 22B collectively serves such the top electrode of the capacitor 26.

In an alternative embodiment, a second dielectric material layer is disposed between the second MTJ stack 36B and the conductive feature 44B. The second dielectric material layer includes one of silicon oxide, silicon nitride, aluminum oxide, and a combination thereof, according to one embodiment. In another embodiment, the second dielectric material layer has a thickness ranging between about 20 angstrom and about 700 angstrom. In this embodiment, the second metal feature 20B, the first dielectric material layer 50B, and the conductive feature 34B forms a first capacitor. The second MTJ stack 36B, the second dielectric material layer, and the conductive feature 44B forms a second capacitor. The first and second capacitors are connected in series, collectively constituting the capacitor 26.

Various advantages may present. By utilizing the semiconductor structure 10, the capacitor is formed in the interconnect structure without occupying silicon area. In one embodiment, the capacitor 26 is formed with the magneto-resistive memory device 24 without additional fabrication cost or additional cycle time.

Figure 2:
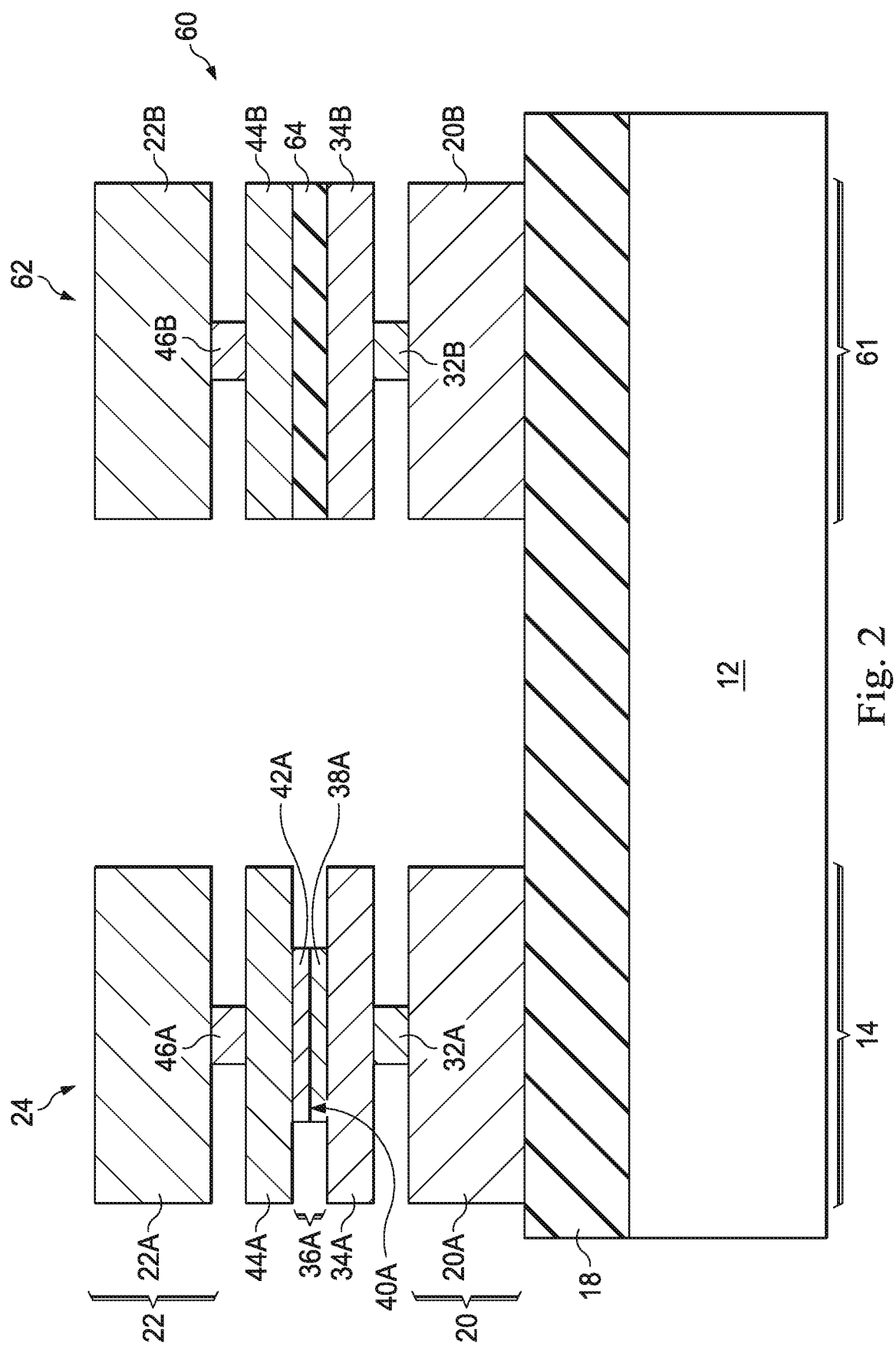
FIG. 2 is a sectional view of a semiconductor structure having a magneto-resistive memory device and a capacitor constructed according to aspects of the present disclosure in another embodiment.

FIG. 2 is a sectional view of a semiconductor structure 60 having a magneto-resistive memory device 24 and a capacitor 62 constructed according to aspects of the present disclosure in another embodiment. The semiconductor structure 60 is similar to the semiconductor structure 10 in FIG. 1. The similar features and the corresponding descriptions are not repeated for simplicity. For example, the magneto-resistive memory device 24 in FIG. 2 is similar to the magneto-resistive memory device 24 in FIG. 1. However, the capacitor 62 is different from the capacitor 26.

The semiconductor structure 60 includes a first region 14 and a second region 61. The magneto-resistive memory device 24 is disposed in a first region 14 and the capacitor 62 is disposed in the second region 61. In stead of having a dielectric material layer 50B, the capacitor 62 is alternatively includes conductive feature 32B serving as a via to connect the conductive feature 34B to the second metal feature 20B. The conductive features 32A and 32B are similar in terms of composition, formation and configuration. In the present embodiment, the conductive features 32A and 32B are simultaneously formed in a same procedure.

Particularly, instead of having the second MTJ stack 36B, the capacitor 62 includes a dielectric material layer 64 disposed between the conductive features 34B and 44B. The dielectric material layer 64 includes one of silicon oxide, silicon nitride, aluminum oxide, and a combination thereof, according to one embodiment. In another embodiment, the dielectric material layer 64 has a thickness ranging between about 20 angstrom and about 700 angstrom. In the present embodiment, the dielectric material layer 64 serves as the capacitor dielectric. The second metal feature 20B and the conductive features (32B and 34B) serve as the bottom electrode of the capacitor 62. The fourth metal feature 22B and the conductive features (46B and 44B) serve as the top electrode of the capacitor 62.

FIGS. 3A through 3F illustrate a semiconductor structure 70, in portion, at various fabrication stages constructed according to one or more embodiment. The semiconductor structure 70 is similar to the semiconductor structure 10 in FIG. 1. In FIGS. 3A through 3F, some material layers or features are labeled differently for easy to understand in considering the process flow. Some features are not shown, such as substrate, for simplicity. The semiconductor structure 70 and the method making the same are described collectively with reference to FIGS. 3A through 3F.

Figure 3A:
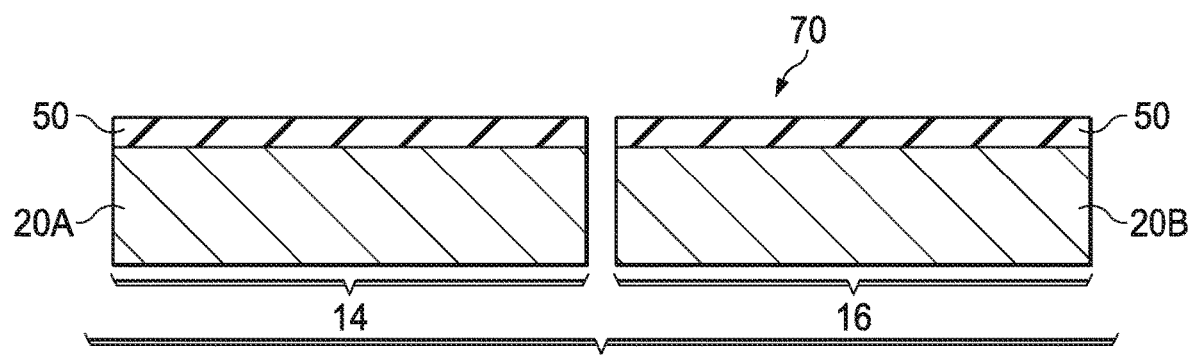
FIGS. 3A-3F are sectional views of a semiconductor structure at various fabrication stages constructed according to aspects of the present disclosure in one or more embodiment.

Referring to FIG. 3A, the first metal layer ($M_x$) 20 is deposited and is patterned to have the first metal feature 20A in the first region 14 and the second metal feature 20B in the second region. In one embodiment, the metal features 20A and 20B are formed by deposition and patterning. The patterning includes lithography process and etching. In furtherance of the embodiment, the metal features 20A and 20B include aluminum or aluminum alloy with addition of copper and silicon. In another embodiment, the metal features 20A and 20B are formed by a damascene (or single or dual damascene) process that includes dielectric deposition, dielectric etching to form trenches, deposition to fill in the trenches and polishing (such as chemical mechanical polish or CMP). The damascene process may further include another CMP process applied to the dielectric material for planarization.

Still referring to FIG. 3A, a dielectric material layer 50 is deposited on the first metal layer 20. The dielectric material layer 50 includes one of silicon carbide, silicon nitride, silicon oxide and a combination thereof. In one embodiment, the dielectric material layer 50 includes a thickness ranging between about 20 angstrom and about 700 angstrom. In another embodiment, the dielectric material layer 50 is deposited by CVD or other suitable technique.

Figure 3B:
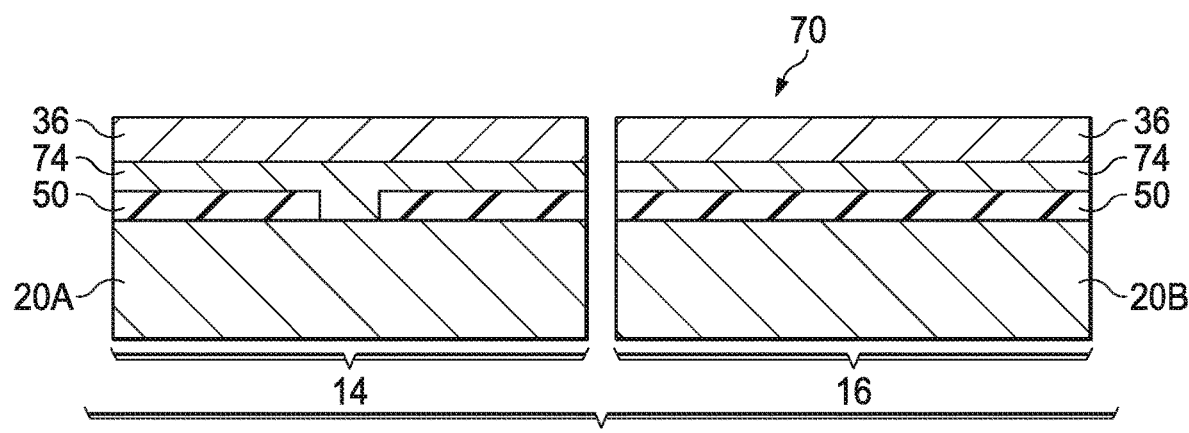

Referring to FIG. 3B, the dielectric material layer 50 is pattered to form an opening (via) in the first region such that the first metal feature 20A is exposed. The dielectric material layer 50 is pattered to form a dielectric feature (labeled as 50B in FIG. 1) on the second metal feature 20B.

Still referring to FIG. 3B, a conductive material layer 74 is deposited on the dielectric material layer 50 and the first metal feature 20A within the opening, by a suitable technique such as PVD. A CMP process may be subsequently applied to the conductive material layer 74. The conductive material layer 74 includes Ta, TaN, other suitable metal or combination thereof.

Still referring to FIG. 3B, MTJ material layers 36 are deposited on the conductive material layer 74. The MTJ material layers 36 are described in FIG. 1. For example, the MTJ material layers 36 includes a anti-ferromagnetic layer 38, a barrier layer 40 on the anti-ferromagnetic layer 38 and a ferromagnetic layer 42 on the barrier layer 40.

Figure 3C:
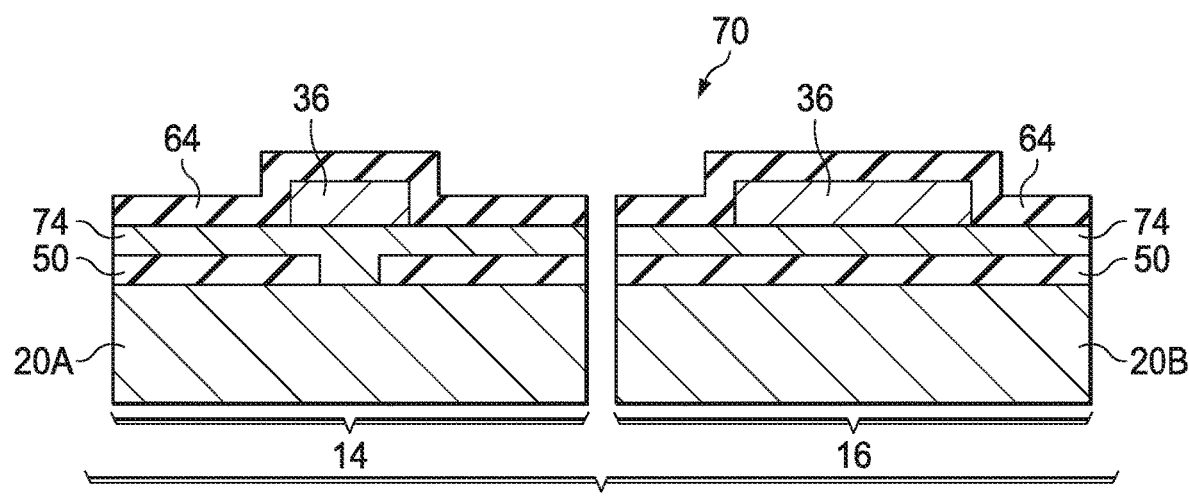

Referring to FIG. 3C, the MTJ material layers 36 are further patterned to form a first MTJ stack (labeled as 36A in FIG. 1) in the first region 14 and a second MTJ stack 36B in the second region 16 by a procedure including deposition and etching.

Still referring to FIG. 3C, a dielectric material layer 64 is deposited on the conductive material layer 74 and the MTJ stacks. The dielectric material layer 64 includes one of silicon oxide, silicon nitride, aluminum oxide, and a combination thereof. In one embodiment, the dielectric material layer 64 includes a thickness ranging between about 20 angstrom and about 700 angstrom. In another embodiment, the dielectric material layer 64 is deposited by CVD or other suitable technique.

Figure 3D:
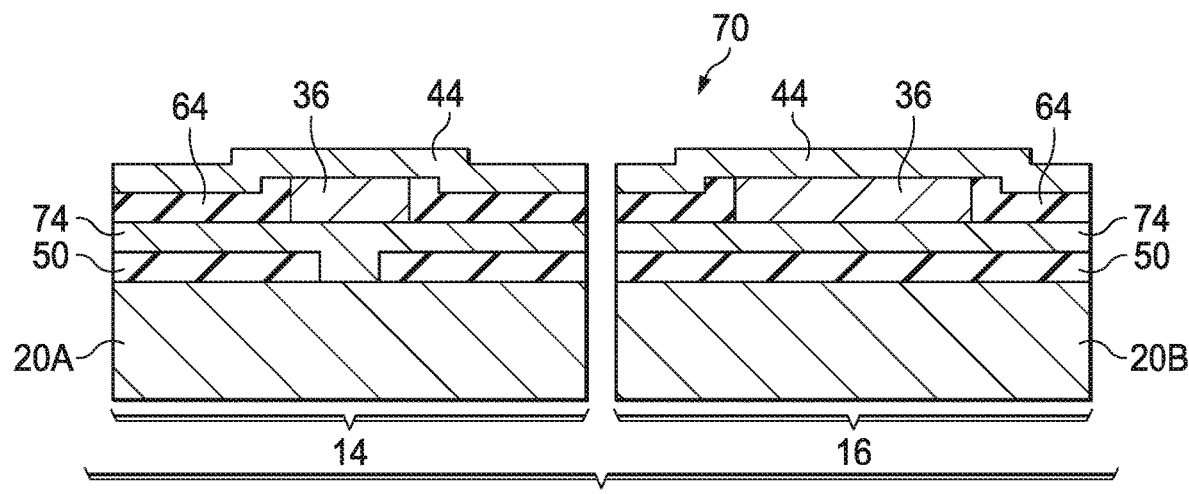

Referring to FIG. 3D, an etch-back process is applied to the dielectric material layer 64 such that the dielectric material layer 64 on the MTJ stacks is removed and the MTJ stacks are uncovered. In one embodiment, the etch-back process includes coating another material on the substrate to have a substantially planar surface. For example, resist layer or other suitable material is by spin-on coated. Then an etch process is applied to etch back both the coated material and the dielectric material layer 64. The etchant and coated material are chosen such that the etch rate of both the coated material and the dielectric material layer 64 are substantially same.

In alternative embodiment, the dielectric material layer 64 is patterned such that a portion on the first MTJ stack 36A is removed and another portion on the second MTJ stack 36B remains.

Still referring to FIG. 3D, a conductive material layer 44 is deposited on the MTJ stacks by a suitable technique such as PVD. The conductive material layer 44 includes Ta, TaN, other suitable metal or combination thereof.

Figure 3E:
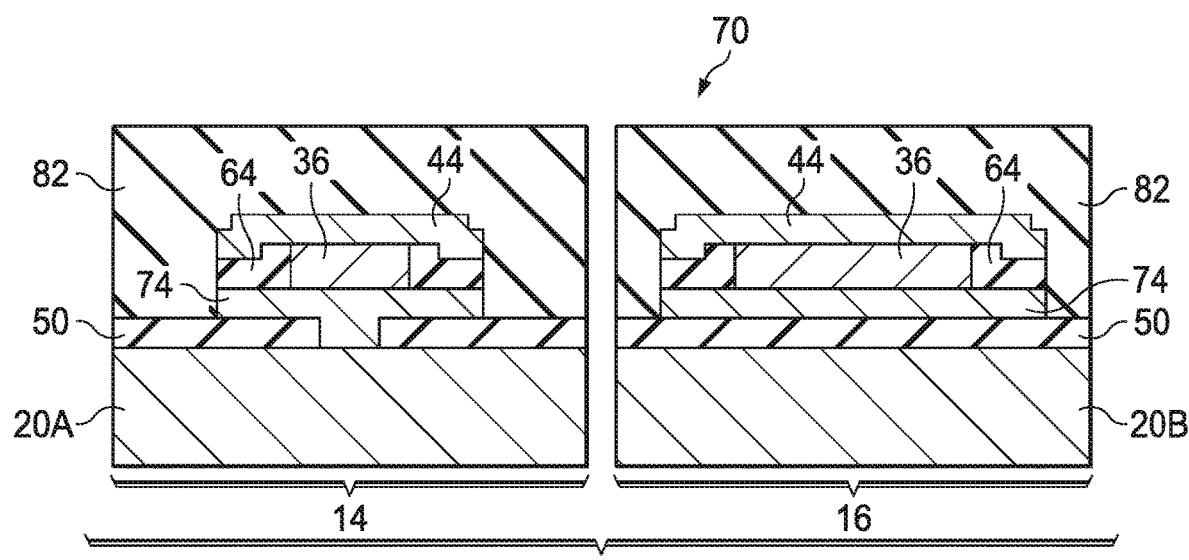

Referring to FIG. 3E, the conductive material layers 74 and 44 are patterned by lithography process and etching. In one embodiment, the patterning includes forming a hard mask used as an etch mask. By patterning the conductive material layer 74, various conductive features 32A, 32B, 34A and 34B in FIG. 1 are formed.

Still referring to FIG. 3E, a dielectric material layer 82 is deposited. The dielectric material layer 82 serves as inter-metal dielectric (IMD). The dielectric material layer 82 includes silicon oxide, low k dielectric material, other suitable dielectric material, or a combination thereof. The dielectric material layer 82 is deposited by CVD, spin-on coating, or other suitable technique.

Figure 3F:
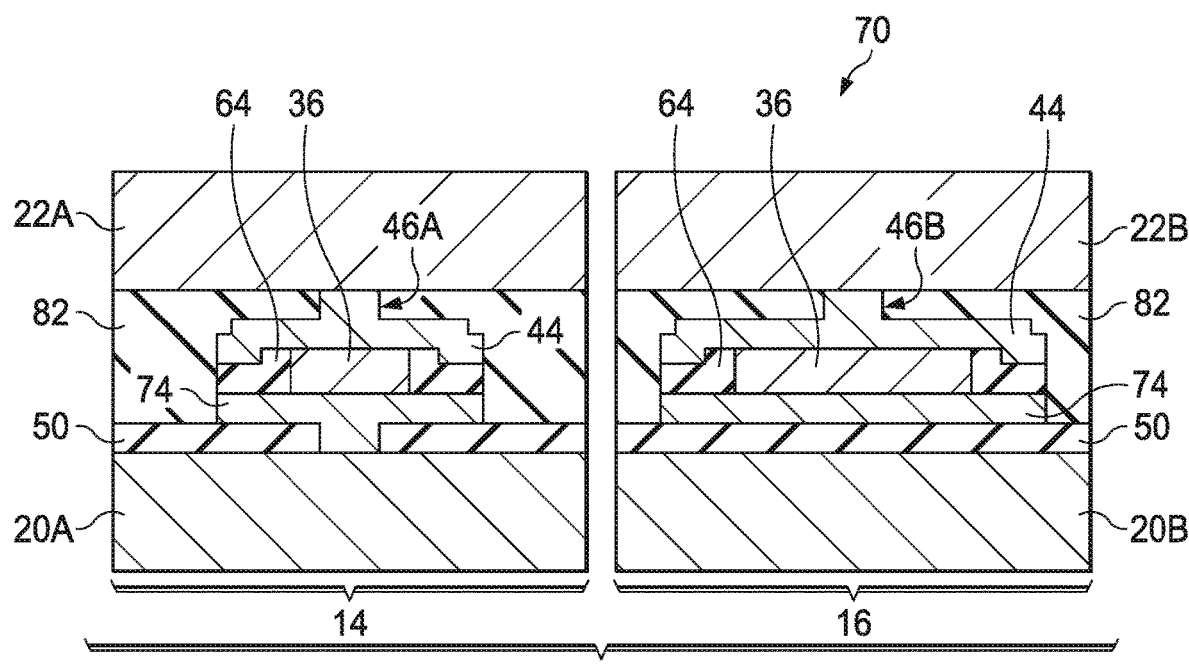

Referring to FIG. 3F, a CMP process is subsequently applied to the dielectric material layer for planarization. Then, the conductive features (46A and 46B) and the metal features (22A and 22B) are formed by a suitable technique, such as a dual damascene process.

FIGS. 4A through 4F illustrate a semiconductor structure 90, in portion, at various fabrication stages constructed according to one or more embodiment. The semiconductor structure 90 is similar to the semiconductor structure 60 in FIG. 2. In FIGS. 4A through 4F, some material layers or features are labeled differently. Some features, such as substrate, are not shown. The semiconductor structure 90 and the method making the same are further described collectively with reference to FIGS. 4A through 4F.

Figure 4A:
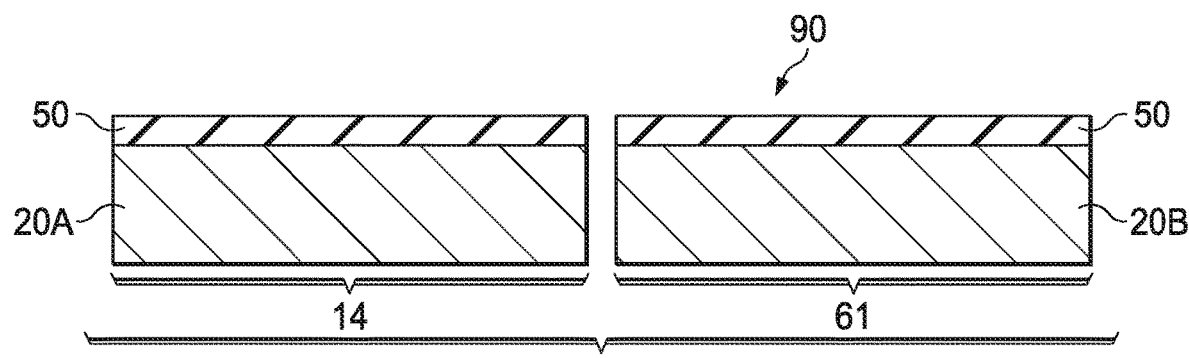
FIGS. 4A-4F are sectional views of a semiconductor structure at various fabrication stages constructed according to aspects of the present disclosure in one or more embodiment

Referring to FIG. 4A, the first metal layer ($M_x$) 20 is deposited and is patterned to have the first metal feature 20A in the first region 14 and the second metal feature 20B in the second region. In one embodiment, the metal features 20A and 20B are formed by deposition and patterning. The patterning includes lithography process and etching. In furtherance of the embodiment, the metal features 20A and 20B include aluminum or aluminum alloy with addition of copper and silicon. In another embodiment, the metal features 20A and 20B are formed by a damascene (or single or dual damascene) process that includes dielectric deposition, dielectric etching to form trenches, depositing to fill in the trenches and polishing (such as chemical mechanical polish or CMP). The damascene process may further include another CMP process applied to the dielectric material for planarization.

Still referring to FIG. 4A, a dielectric material layer 50 is deposited on the first metal layer 20. The dielectric material layer 50 includes one of silicon carbide, silicon nitride, silicon oxide and a combination thereof. In one embodiment, the dielectric material layer 50 includes a thickness ranging between about 20 angstrom and about 700 angstrom. In another embodiment, the dielectric material layer 50 is deposited by CVD or other suitable technique.

Figure 4B:
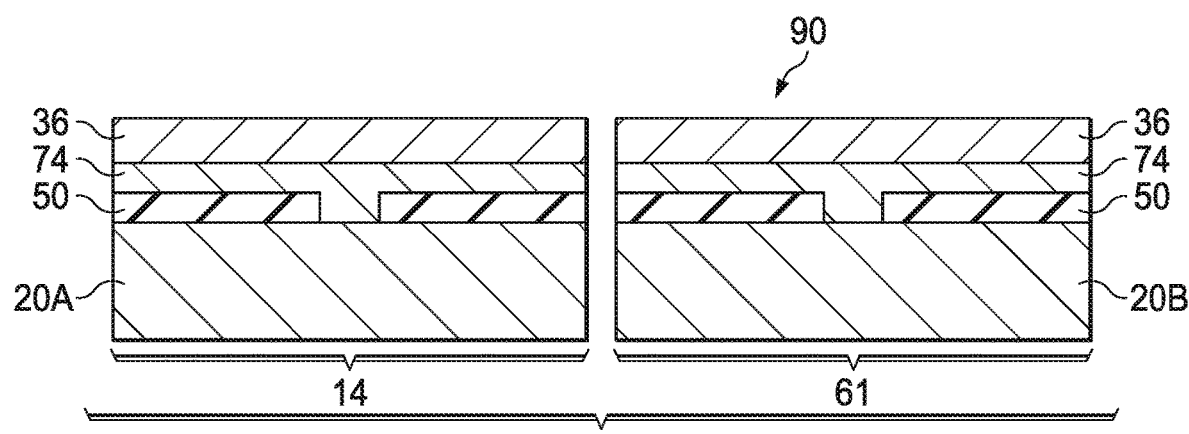

Referring to FIG. 4B, the dielectric material layer 50 is patterned to form a first opening (via) in the first region 14 and a second opening (via) in the second region 61 such that the first and second metal features (20A and 20B) are exposed within the respective openings.

Still referring to FIG. 4B, a conductive material layer 74 is deposited on the dielectric material layer 50 and fills in the vias of the dielectric layer 50. Particularly, the conductive material layer 74 is disposed directly on the first and second metal features 20A and 20B within the respective opening. A CMP process may be subsequently applied to the conductive material layer 74. The conductive material layer 74 includes Ta, TaN, other suitable metal or combination thereof.

Still referring to FIG. 4B, MTJ material layers 36 are deposited on the conductive material layer 74. The MTJ material layers 36 includes an anti-ferromagnetic layer 38, a barrier layer 40 on the anti-ferromagnetic layer 38 and a ferromagnetic layer 42 on the barrier layer 40.

Figure 4C:
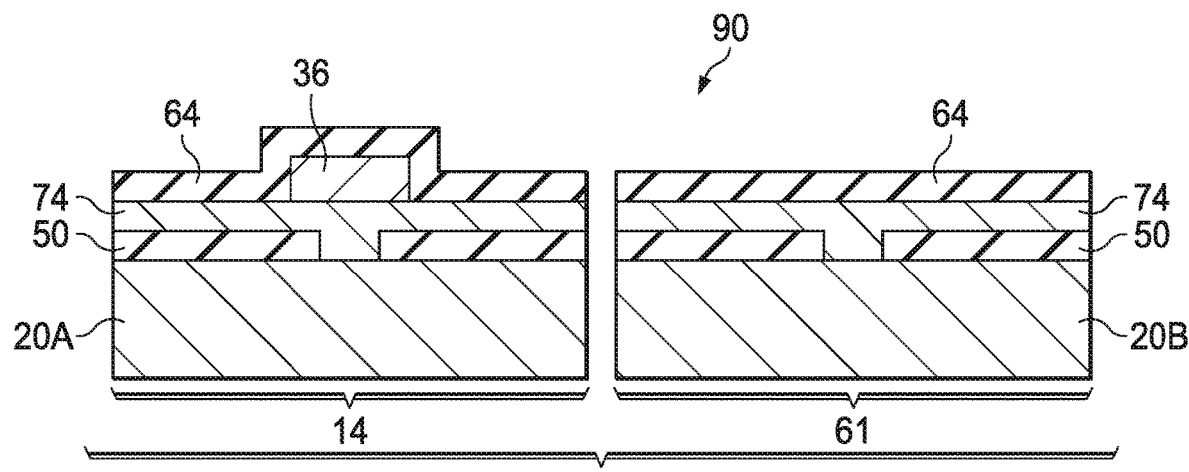

Referring to FIG. 4C, the MTJ material layers 36 are further patterned to form a MTJ stack (labeled as 36A in FIG. 1) in the first region 14 by a procedure including deposition and etching. Different from the semiconductor structure 70, the MTJ material layers 36 are completely removed from the second region 61.

Still referring to FIG. 4C, a dielectric material layer 64 is deposited on the conductive material layer 74 and the MTJ stack. The dielectric material layer 64 includes one of silicon oxide, silicon nitride, aluminum oxide, and a combination thereof. In one embodiment, the dielectric material layer 64 includes a thickness ranging between about 20 angstrom and about 700 angstrom. In another embodiment, the dielectric material layer 64 is deposited by CVD or other suitable technique.

Figure 4D:
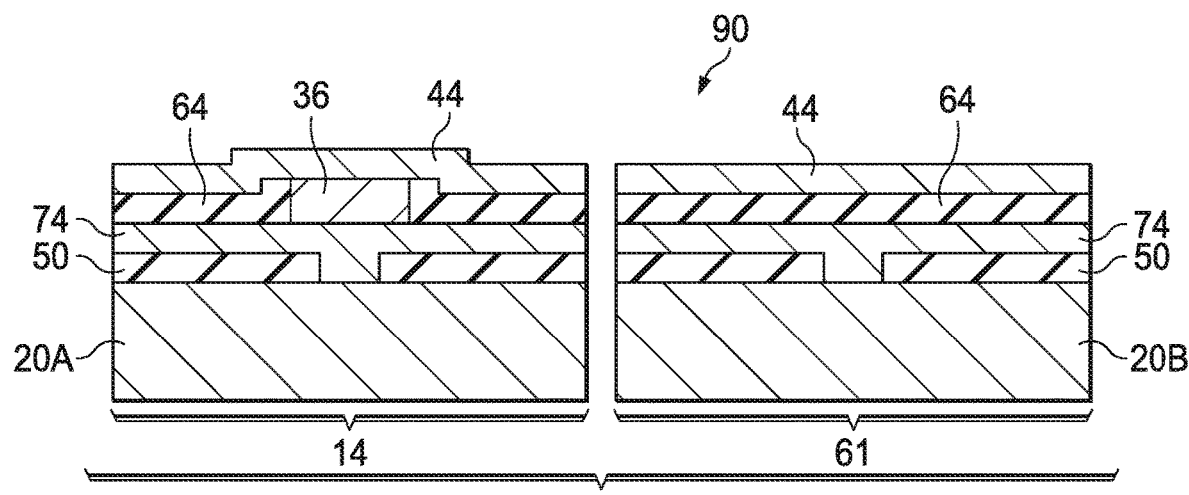

Referring to FIG. 4D, an etch-back process is applied to the dielectric material layer 64 such that the dielectric material layer 64 on the MTJ stack is removed.

Still referring to FIG. 4D, a conductive material layer 44 is deposited on the MTJ stacks by a suitable technique such as PVD. The conductive material layer 44 includes Ta, TaN, other suitable metal or combination thereof.

Figure 4E:
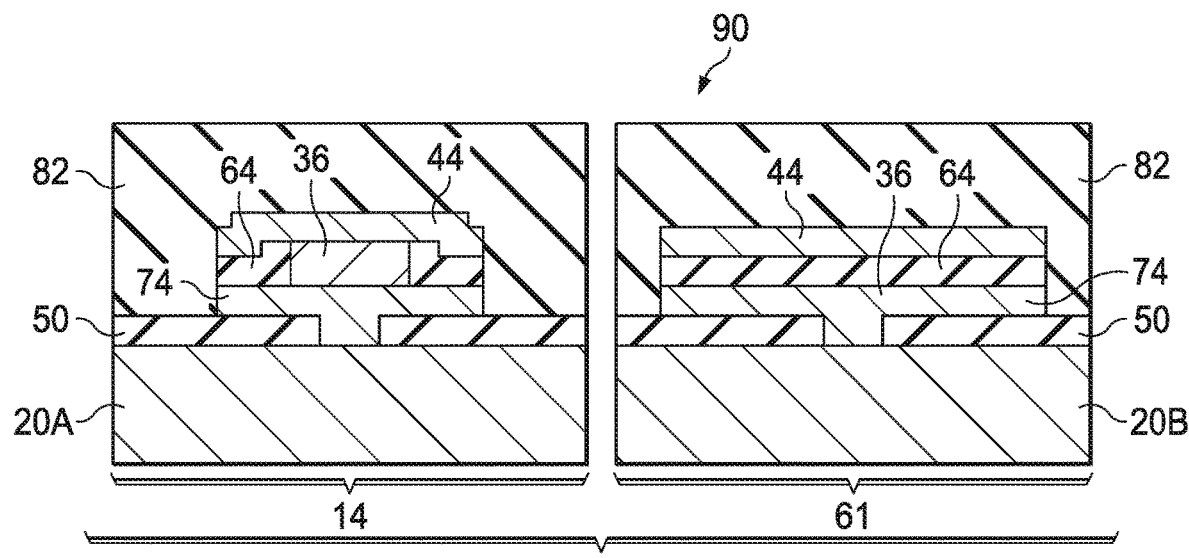

Referring to FIG. 4E, the conductive material layers 74 and 44 are patterned by lithography process and etching. Thereby, the magneto-resistive memory device 24 is formed in the first region 14 and includes bottom electrode 74, MTJ stack and top electrode 44. The capacitor 62 is formed in the second region 61 and includes bottom electrode 74, dielectric material 64 and top electrode 44.

Still referring to FIG. 4E, a dielectric material layer (IMD) 82 is deposited. The dielectric material layer 82 includes silicon oxide, low k dielectric material, other suitable dielectric material, or a combination thereof. The dielectric material layer 82 is deposited by CVD, spin-on coating, or other suitable technique.

Figure 4F:
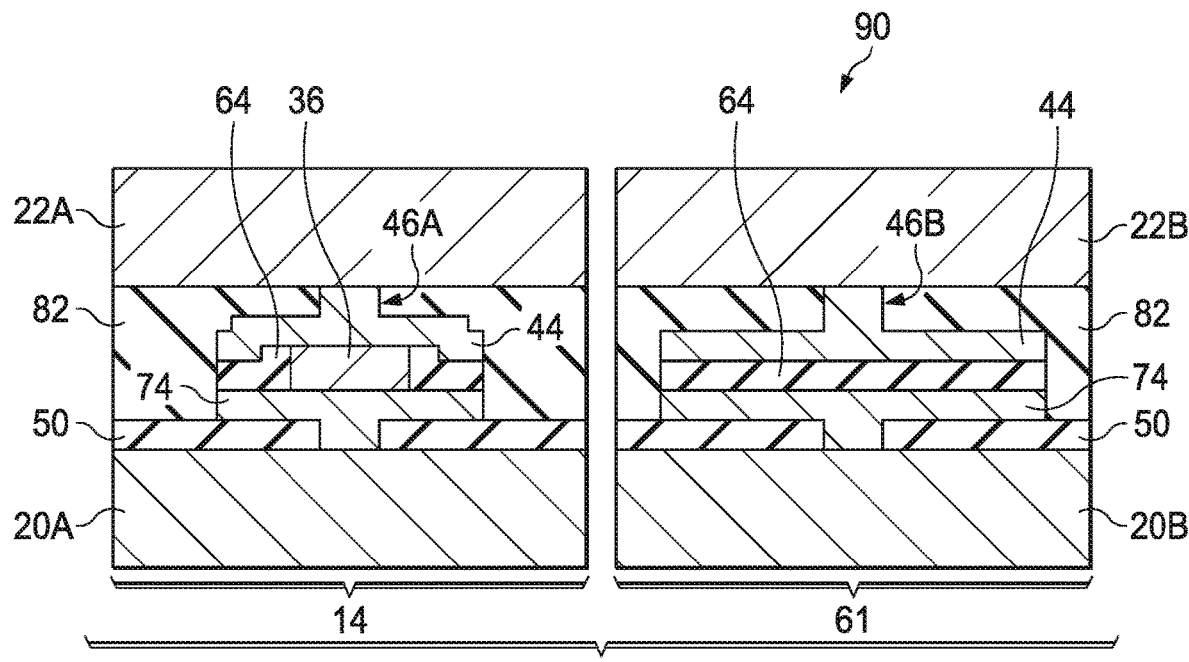

Referring to FIG. 4F, a CMP process is subsequently applied to the dielectric material layer for planarization. The conductive features (46A and 46B) and the metal features (22A and 22B) are collectively formed by a dual damascene process.

Figure 5:
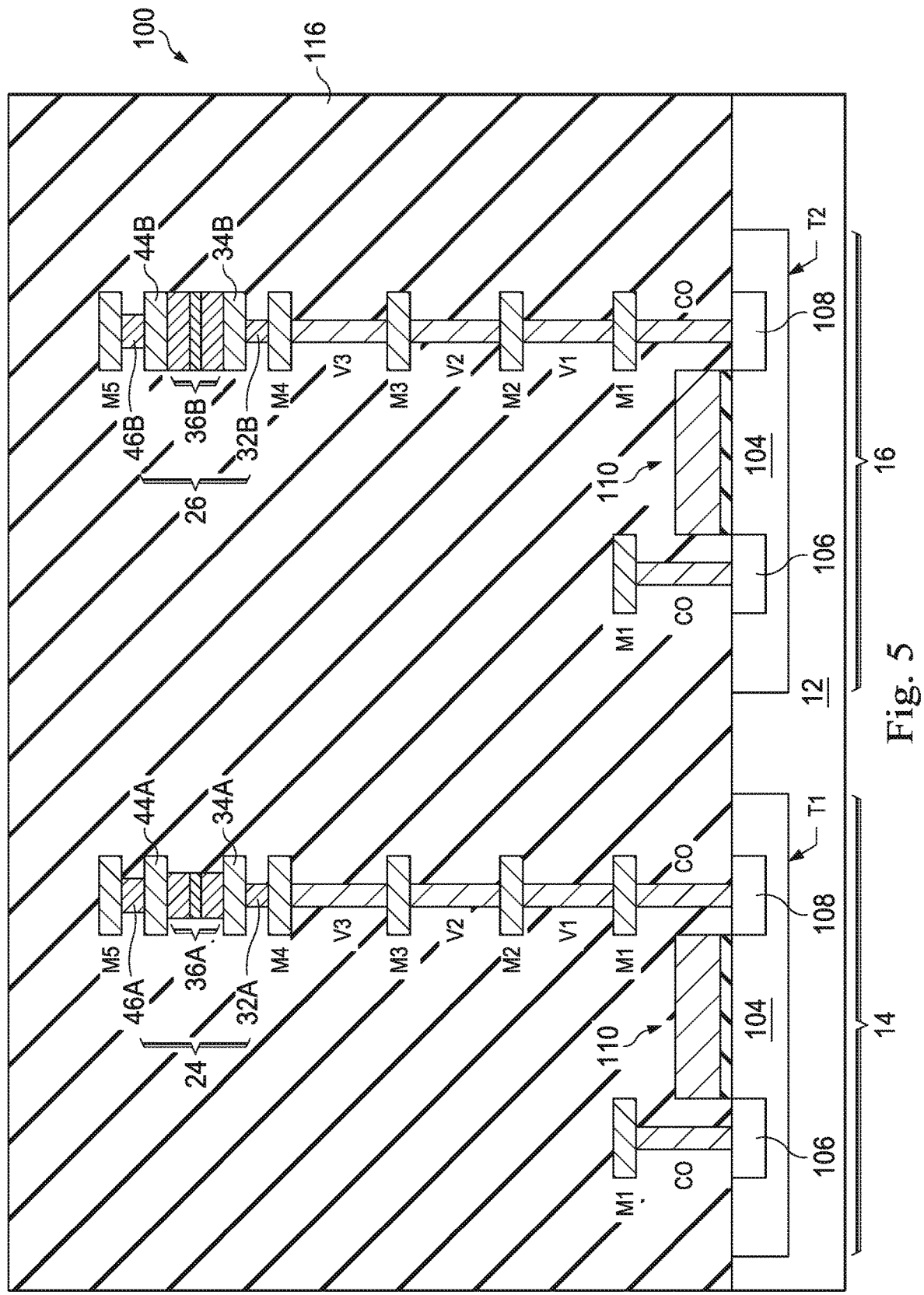
FIG. 5 is a sectional view of a semiconductor structure having a magneto-resistive memory device and a capacitor constructed according to aspects of the present disclosure in another embodiment.

FIG. 5 is a sectional view of a semiconductor structure 100 constructed according to aspects of the present disclosure in various embodiments. In one embodiment, the semiconductor structure 100 is similar to the semiconductor structure 10 but further includes an interconnect structure and other integrated devices, such as field effect transistors. The semiconductor structure 100 includes a first FET "T1" formed in the substrate 12 in the first region 14 and is integrated with the magnetic device 24 to form a magneto-resistive random access memory (MRAM) cell that includes one transistor T1 and one MTJ 24. In one particular example, the MRAM cell is a spin torque transfer magneto-resistive random access memory (STT-MRAM).

Particularly, the FET T1 includes a source 106 and a drain 108 formed in a doped well 104. The doped well is doped with a first type. The source 106 and the drain 108 are doped with a second type opposite to the first type. In the present example, the FET T1 is an n-type FET (nFET). Accordingly, the doped well 104 is p-type well. The source 106 and the drain 108 are n-type. The FET T1 includes a gate 110 formed on the substrate 12. The gate 110 includes a gate dielectric layer and a gate electrode disposed on the gate dielectric layer. The FET T1, such as its drain 108, is electrically connected to the magneto-resistive memory device 24.

The magneto-resistive memory device 24 is formed in an interconnect structure 116. The interconnect structure 116 includes metal lines distributed in a plurality of metal layers, such as first metal layer (M1), M2 and so on. As an example for illustration, the interconnect structure 116 in FIG. 5 illustrates 5 metal layers that are respectively labeled as M1, M2, M3, M4 and M5. This is only an example not meant to limit the scope of the disclosure, the interconnect structure 116 may include more or less metal layers. The interconnect structure 116 also includes contact features to provide connection between the substrate 12 and the first metal layer M1. The contact features are labeled as "C0". The interconnect structure 116 also includes via features to provide connection between adjacent metal layers (such as M1 and M2). The via features are labeled as V1, V2, V3 and V4 to represent the via features between M1 & M2, M2 & M3, and M3 & M4, respectively.

The magneto-resistive memory device 24 is formed in the interconnect structure 116 and is disposed between two metal layers. In the example illustrated in FIG. 5, the magneto-resistive memory device 24 is disposed between M4 and M5. The magneto-resistive memory device 24 includes the MTJ stack 36A interposed between the top electrode 44A and the bottom electrode 34A. The bottom electrode 34A is directly contacted with a bottom via feature 32A and is further coupled to the drain 108 of the FET T1. The top electrode 44A is directly contacted with a top via feature 46A and is further coupled to the metal feature in the M5 layer.

The MRAM cell may include other features, such as shallow trench isolation (STI) formed in the substrate 12 to provide isolation to various memory cells and other circuit devices.

The semiconductor structure 100 also includes a second FET "T2" formed in the substrate 12 in the first region 16 and is integrated with the capacitor 26 to form a circuit component for various applications, such as charge pump or reservoir capacitor. The FET T2 is similar to the FET T1 in terms of formation and configuration. The FET T2, such as its drain 108, is electrically connected to the capacitor 26.

The capacitor 26 is formed in an interconnect structure 116. The capacitor 26 is formed in the interconnect structure 116 and is disposed between two metal layers. Specifically, the capacitor 26 and the magneto-resistive memory device 24 are disposed at a same level and are formed simultaneously by a same procedure.

In the example illustrated in FIG. 5, the capacitor 26 is disposed between M4 and M5. The capacitor 26 includes the MTJ stack 36B interposed between the top electrode 44B and the bottom electrode 34B. In this example, the bottom electrode 34B is directly contacted with a bottom via feature 32B and is further coupled to the drain 108 of the FET T2. The top electrode 44B is directly contacted with a top via feature 46B and is further coupled to the metal feature in the M5 layer.

Various suitable techniques may be used to form respective features in the semiconductor structure 100. For example, the gates 110 include the gate dielectric layer and the gate electrode layer. In one embodiment, the gate dielectric layer includes silicon oxide, high k dielectric material or other suitable dielectric material. The gate electrode layer includes metal, polycrystalline silicon (polysilicon) or other suitable conductive material. In one embodiment, the gate material layers include high k dielectric material and metal, therefore, referred to as high k metal gate. In one embodiment, the gate dielectric layer includes an interfacial layer (such as silicon oxide) and a high k dielectric material layer, such as hafnium oxide (HfO) or other suitable metal oxide. The gate electrode layer includes a metal (or metal alloy) layer and may further include a polysilicon layer on the metal layer.

Figure 6:
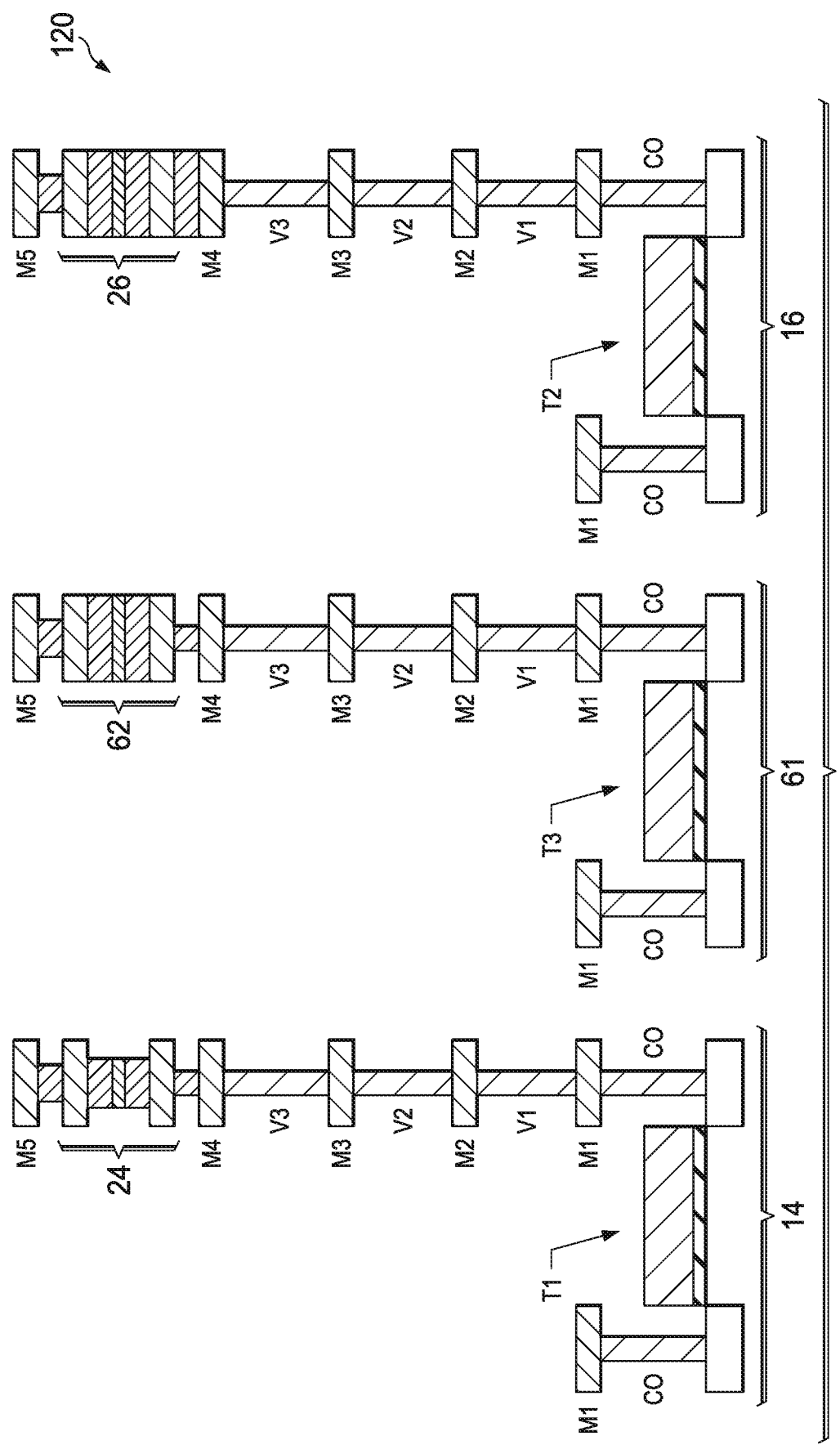
FIG. 6 is a sectional view of a semiconductor structure having a magneto-resistive memory device and a capacitor constructed according to aspects of the present disclosure in another embodiment.

In an alternative embodiment, the semiconductor structure may additionally or alternatively include a capacitor 62 of FIG. 2. An example is illustrated in FIG. 6. FIG. 6 is a sectional view of a semiconductor structure 120 that includes the magneto-resistive memory device 24, the capacitor 26 and capacitor 62 formed on a same semiconductor substrate. Particularly, the semiconductor structure includes a first region 14, a second region 16 and a third region 61. The semiconductor structure 120 includes the magneto-resistive memory device 24, the capacitor 26 and capacitor 62 disposed in the first, second and third regions, respectively. In the present embodiment, the semiconductor structure 120 further includes transistors "T1", "T2", and "T3" disposed in the three regions, regions, respectively. Furthermore, Transistors "T1", "T2", and "T3" are integrated with the magneto-resistive memory device 24, capacitor 26 and capacitor 62, respectively, as illustrated in FIG. 6.

Figure 7:
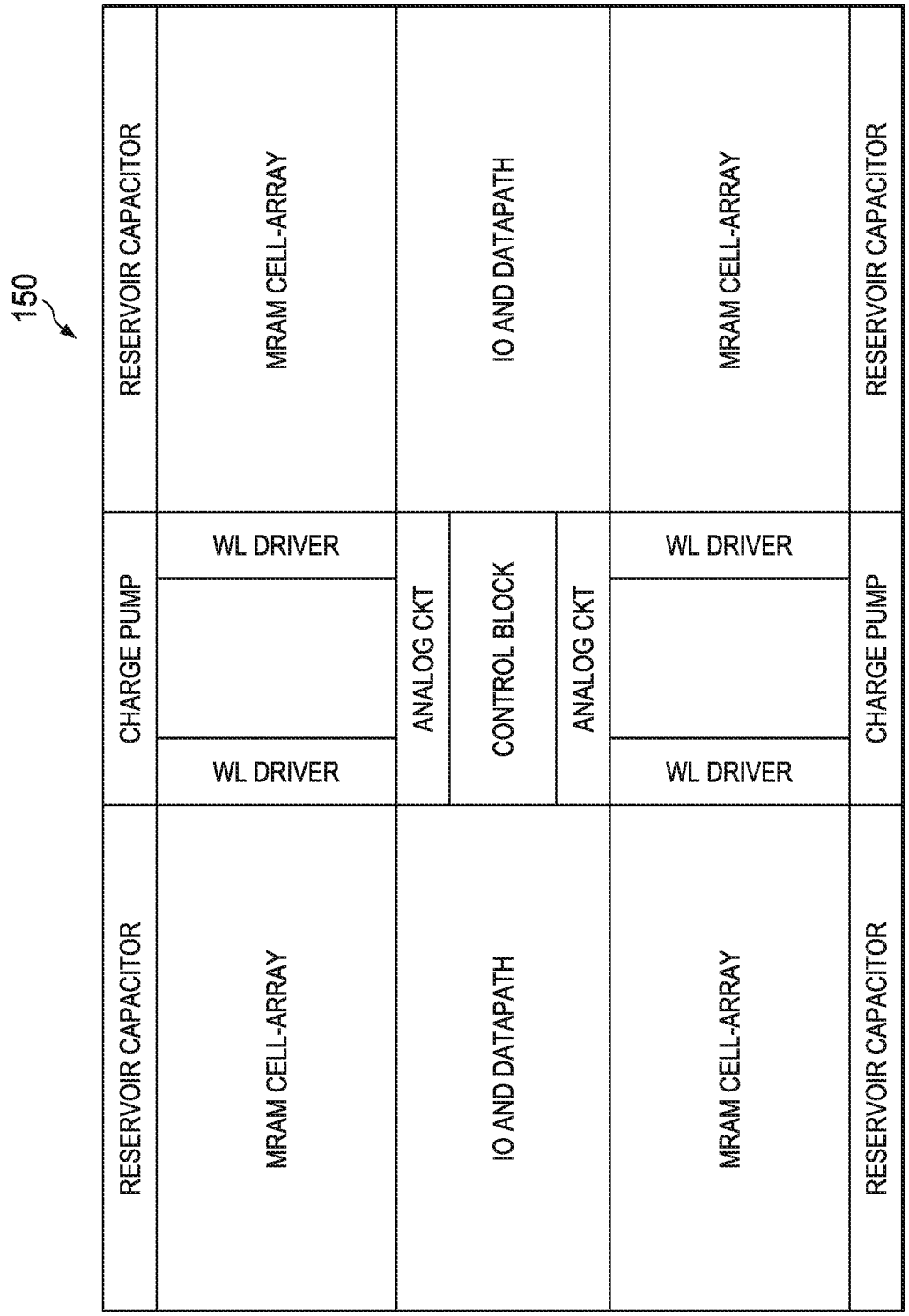
FIG. 7 is a schematic view of an integrated circuit constructed according to aspects of the present disclosure in one embodiment.

The present disclosure is described above in various embodiments. Other features, process steps and alternatives may present. For example, the magneto-resistive memory device 24 may further include a capping layer. The semiconductor structure with magneto-resistive memory device and capacitor in various embodiments may be incorporated in various applications. One integrated circuit 150 is illustrated in FIG. 7. The circuit 150 includes various circuit modules, such as MRAM cell array, input/output (I/O) and data-path module, and control circuit block, analog circuit, reservoir capacitor and charge pump. In one example, the capacitor is used as a part of RC compensation network for analog circuit. In other examples, the capacitor is used in the reservoir capacitor and/or charge pump. In the disclosed structure according to one or more embodiment, the capacitor is formed in the interconnect structure at backend without cost of silicon area. The corresponding modules, such as reservoir capacitor and charge pump occupy much less silicon area with fewer footprints. Additionally, according to another embodiment, the capacitor is simultaneously formed with the magneto-resistive memory device in a same process flow without additional fabrication cost, such as without additional photomask and lithography cycle.

Thus, the present disclosure provides a semiconductor structure that includes a first metal layer formed on a semiconductor substrate, wherein the first metal layer includes a first metal feature in a first region and a second metal feature in a second region; a second metal layer disposed on the first metal layer, wherein the second metal layer includes a third metal feature in the first region and a fourth metal feature in a second region; a magneto-resistive memory device sandwiched between the first metal feature and the third metal feature; and a capacitor sandwiched between the second metal feature and the fourth metal feature.

The present disclosure also provides another embodiment of a semiconductor structure. The semiconductor structure includes a semiconductor substrate having a first region and a second region; an interconnect structure having a first metal layer over the semiconductor substrate and a second metal layer over the first metal layer and being adjacent to the first metal layer; a magneto-resistive memory device disposed between the first and second metal layer within the first region; and a capacitor disposed between the first and second metal layers within the second region. The capacitor includes an anti-ferromagnetic material and a ferromagnetic material.

The present disclosure also provides an embodiment of a method that includes providing a substrate having a first region and a second region; forming, on the substrate, a metal layer having a first metal feature in the first region and a second metal feature in the second region; forming a first dielectric feature in the second region and on the second metal feature; depositing materials layers including an anti-ferromagnetic material layer, a barrier layer and a ferromagnetic material layer on the first metal feature in the first region and on the first dielectric feature in the second region; patterning the material layers to form a first magnetic tunneling junction (MTJ) in the first region and a second MTJ stack in the second region; and forming a second metal layer on the patterned material layers, wherein the second metal layer includes a third metal feature in the first region and a fourth metal feature in the second region. The first metal feature, the first MTJ stack and the third metal features are configured as a magneto-resistive memory device in the first region. The second metal feature, the first dielectric feature, and the second MTJ stack are configured as a first capacitor in the second region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a magneto-resistive memory device and a capacitor in an interconnect structure, wherein the magneto-resistive memory device is disposed in a first region of the interconnect structure and the capacitor is disposed in a second region of the interconnect structure, the method comprising:

forming a first level interconnect metal layer of the interconnect structure;

simultaneously forming a first plurality of layers in the first region of the interconnect structure over the first level interconnect metal layer and a second plurality of layers in the second region of the interconnect structure over the first level interconnect metal layer, wherein the first plurality of layers is a portion of the magneto-resistive memory device and the second plurality of layers is a portion of the capacitor, wherein the forming the first plurality of layers in the first region and the second plurality of layers in the second region includes:

depositing a first dielectric layer on the first level interconnect metal layer in the first region and the second region, depositing a first metal layer on the first dielectric layer in the first region and the second region, forming an MTJ stack on the first metal layer in the first region, depositing a second dielectric layer on the first metal layer in the first region and the second region, wherein the second dielectric layer directly contacts an entire top surface of the first metal layer in the second region, depositing a second metal layer on the second dielectric layer in the first region and the second region, wherein the second metal layer is disposed directly on and covers an entirety of a top surface of the MTJ stack, an entirety of a top surface of the second dielectric layer in the first region, and an entirety of a top surface of the second dielectric layer in the second region, and after the depositing the first metal layer, the forming the MTJ stack, the depositing the second dielectric layer, and the depositing the second metal layer, etching the second metal layer, the second dielectric layer, and the first metal layer, such that:

the first plurality of layers includes the MTJ stack disposed between a first etched portion of the second metal layer and a first etched portion of the first metal layer, wherein a first etched portion of the second dielectric layer is disposed between the first etched portion of the second metal layer and the first etched portion of the first metal layer; and the second plurality of layers includes a second etched portion of the second dielectric layer disposed between a second etched portion of the second metal layer and a second etched portion of the first metal layer; and forming a second level interconnect metal layer of the interconnect structure over the first plurality of layers and the second plurality of layers.

2. The method of claim 1, wherein the forming the first plurality of layers in the first region and the second plurality of layers in the second region further includes depositing a third dielectric layer after etching the second metal layer, the second dielectric layer, and the first metal layer.

3. The method of claim 2, wherein the third dielectric layer is disposed along sidewalls of the first etched portion of the second metal layer, sidewalls of the first etched portion of the first metal layer, sidewalls of the first etched portion of the second dielectric layer, sidewalls of the second etched portion of the second metal layer, sidewalls of the second etched portion of the first metal layer, and sidewalls of the second etched portion of the second dielectric layer.

4. The method of claim 1, further comprising patterning the first dielectric layer to form an opening in the first dielectric layer that exposes a portion of the first level interconnect metal layer in the first region, wherein the first metal layer fills the opening during the depositing of the first metal layer.

5. The method of claim 4, wherein the opening is a first opening, and the patterning the first dielectric layer further includes forming a second opening in the first dielectric layer that exposes a portion of the first level interconnect metal layer in the second region, wherein the first metal layer fills the second opening during the depositing of the first metal layer.

6. The method of claim 1, wherein the first level interconnect metal layer is a fourth level of the interconnect structure, and the second level interconnect metal layer is a fifth level of the interconnect structure.

7. A method for forming a magneto-resistive memory device and a capacitor in an interconnect structure, wherein the magneto-resistive memory device is disposed in a first region of the interconnect structure and the capacitor is disposed in a second region of the interconnect structure, the method comprising:
forming a first level interconnect metal layer of the interconnect structure;
simultaneously forming a first plurality of layers in the first region of the interconnect structure over the first level interconnect metal layer and a second plurality of layers in the second region of the interconnect structure over the first level interconnect metal layer, wherein the first plurality of layers is a portion of the magneto-resistive memory device and the second plurality of layers is a portion of the capacitor, wherein the forming the first plurality of layers in the first region and the second plurality of layers in the second region includes:
forming a first dielectric layer directly on the first level interconnect metal layer, wherein the first dielectric layer covers a first portion of a top surface of a first metal feature of the first level interconnect metal layer in the first region and covers an entirety of a top surface of a second metal feature of the first level interconnect metal layer in the second region,
depositing a first metal layer directly on the first dielectric layer in the first region and the second region, wherein the first metal layer extends through the first dielectric layer to directly contact a second portion of the top surface of the first metal feature, and further wherein the first metal layer does not directly contact the top surface of the second metal feature,
forming a first MTJ stack on the first metal layer in the first region and a second MTJ stack on the first metal layer in the second region at the same time,
depositing a second dielectric layer on the first metal layer in the first region and the second region,
depositing a second metal layer on the second dielectric layer in the first region and the second region, wherein the second metal layer is disposed directly on and covers an entirety of a top surface of the first MTJ stack, an entirety of a top surface of the second MTJ stack, an entirety of a top surface of the second dielectric layer in the first region, and an entirety of a top surface of the second dielectric layer in the second region, and
after the depositing the first metal layer, the forming the first MTJ stack, the forming the second MTJ stack, the depositing the second dielectric layer, and the depositing the second metal layer, etching the second metal layer, the second dielectric layer, and the first metal layer, such that:
the first plurality of layers includes the first MTJ stack disposed between a first etched portion of the second metal layer and a first etched portion of the first metal layer, wherein a first etched portion of the second dielectric layer is disposed between the first etched portion of the second metal layer and the first etched portion of the first metal layer; and
the second plurality of layers includes the second MTJ stack disposed between a second etched portion of the second metal layer and a second etched portion of the first metal layer, wherein a second etched portion of the second dielectric layer is disposed between the second etched portion of the second metal layer and the second etched portion of the first metal layer; and
forming a second level interconnect metal layer of the interconnect structure over the first plurality of layers and the second plurality of layers.

8. The method of claim 7, wherein the forming the first MTJ stack and the second MTJ stack includes depositing MTJ layers and etching the MTJ layers, such that a width of the first MTJ stack is less than a width of the second MTJ stack.

9. A method for forming a magneto-resistive memory device and a capacitor in an interconnect structure, the method comprising:
forming a first level interconnect metal layer of the interconnect structure, wherein the first level interconnect metal layer includes a first metal feature in a first region and a second metal feature in a second region;
depositing a first dielectric layer directly on the first level interconnect metal layer, wherein the first dielectric layer in the second region covers an entirety of a top surface of the second metal feature and the first dielectric layer in the first region covers an entirety of a top surface of the first metal feature;
patterning the first dielectric layer to form a patterned first dielectric layer having an opening in the first region that exposes the top surface of the first metal feature, wherein the patterned first dielectric layer in the second region covers the entirety of the top surface of the second metal feature;
depositing a first metal layer directly on the patterned first dielectric layer in the first region and the second region, wherein the first metal layer completely fills the opening of the patterned first dielectric layer and physically contacts the first metal feature and the patterned first dielectric layer is disposed between the first metal layer and the second metal feature, such that the first metal layer does not physically contact the second metal feature;

depositing and patterning magnetic tunneling junction (MTJ) layers on the first metal layer to form a first MTJ stack in the first region and a second MTJ stack in the second region;

depositing a second dielectric layer on the first metal layer in the first region and the second region;

depositing a second metal layer on the second dielectric layer in the first region and the second region, the first MTJ stack, and the second MTJ stack;

after depositing the first metal layer, depositing and patterning the MTJ layers, depositing the second dielectric layer, and depositing the second metal layer, patterning the second metal layer, the second dielectric layer, and the first metal layer to form a third metal feature and a fourth metal feature in the first region, wherein the first MTJ stack is disposed between the third metal feature and the fourth metal feature, and a fifth metal feature and a sixth metal feature in the second region, wherein the second MTJ stack is disposed between the fifth metal feature and the sixth metal feature, and further wherein the third metal feature is physically separate from the fifth metal feature and the fourth metal feature is physically separate from the sixth metal feature; and forming a second level interconnect metal layer of the interconnect structure, wherein the second level interconnect metal layer includes a seventh metal feature disposed on the fourth metal feature in the first region and an eighth metal feature disposed on the sixth metal feature in the second region.

10. The method of claim 9, further comprising etching back the second dielectric layer to expose a top surface of the first MTJ stack in the first region and a top surface of the second MTJ stack in the second region before depositing the second metal layer.

11. The method of claim 9, wherein the patterning the MTJ layers includes removing a first portion of the MTJ layers in the first region that is greater than a second portion of the MTJ layers in the second region, such that a dimension of the first MTJ stack is less than a dimension of the second MTJ stack.

12. The method of claim 9, wherein the depositing the MTJ layers includes:
depositing an anti-ferromagnetic material layer on the first metal layer;
depositing a barrier material layer on the anti-ferromagnetic material layer; and
depositing a ferromagnetic material layer on the barrier material layer.

13. The method of claim 9, further comprising forming a third dielectric layer after patterning the second metal layer, the second dielectric layer, and the first metal layer and before forming the second level interconnect metal layer.

14. The method of claim 9, wherein the forming the first level interconnect metal layer and the forming the second level interconnect metal layer includes performing a dual damascene process.

15. A method for forming a magneto-resistive memory device and a capacitor in an interconnect structure, the method comprising:
forming a first level interconnect metal layer of the interconnect structure, wherein the first level interconnect metal layer includes a first metal feature in a first region and a second metal feature in a second region;
depositing and patterning a first dielectric layer on the first level interconnect metal layer to form a patterned first dielectric layer having a first opening in the first region that exposes the first metal feature and a second opening in the second region that exposes the second metal feature;

depositing a first metal layer on the patterned first dielectric layer in the first region and the second region, wherein the first metal layer completely fills the first opening of the first dielectric layer in the first region and the second opening of the first dielectric layer in the second region;

depositing and patterning magnetic tunneling junction (MTJ) layers on the first metal layer, such that an MTJ stack is formed on a portion of the first metal layer that completely fills the first opening of the first dielectric layer in the first region;

depositing a second dielectric layer directly on the first metal layer in the first region and the second region, wherein the second dielectric layer directly contacts a portion of a top surface of the first metal layer in the first region and an entirety of a top surface of the first metal layer in the second region;

depositing a second metal layer on the second dielectric layer in the first region and the second region and the MTJ stack;

after depositing the first metal layer, depositing and patterning the MTJ layers, depositing the second dielectric layer, and depositing the second metal layer, patterning the second metal layer, the second dielectric layer, and the first metal layer to form a third metal feature and a fourth metal feature in the first region, wherein the MTJ stack is disposed between the third metal feature and the fourth metal feature, and a fifth metal feature, a sixth metal feature, and a dielectric feature in the second region, wherein the dielectric feature is disposed between the fifth metal feature and the sixth metal feature, and further wherein the third metal feature is physically separate from the fifth metal feature and the fourth metal feature is physically separate from the sixth metal feature; and forming a second level interconnect metal layer of the interconnect structure, wherein the second level interconnect metal layer includes a seventh metal feature disposed on the fourth metal feature in the first region and an eighth metal feature disposed on the sixth metal feature in the second region.

16. The method of claim 15, further comprising etching back the second dielectric layer to expose a top surface of the MTJ stack in the first region before depositing the second metal layer.

17. The method of claim 15, wherein the patterning the MTJ layers includes removing a portion of the MTJ layers in the first region and completely removing the MTJ layers from the second region.

18. The method of claim 15, wherein the depositing the MTJ layers includes:
depositing an anti-ferromagnetic material layer on the first metal layer;
depositing a barrier material layer on the anti-ferromagnetic material layer; and
depositing a ferromagnetic material layer on the barrier material layer.

19. The method of claim 15, further comprising forming a third dielectric layer after patterning the second metal layer, the second dielectric layer, and the first metal layer and before forming the second level interconnect metal layer.

20. The method of claim 15, wherein the forming the first level interconnect metal layer and the forming the second level interconnect metal layer includes performing a dual damascene process.

\* \* \* \* \*